(12) United States Patent
Baiocchi et al.

(10) Patent No.: US 8,318,606 B2
(45) Date of Patent: Nov. 27, 2012

(54) DIELECTRIC ETCHING

(75) Inventors: Frank Baiocchi, Allentown, PA (US); David Kern, Lehighton, PA (US); John DeLucca, Wayne, PA (US)

(73) Assignee: LSI Corporation, Milpitas, CA (US)

( * ) Notice: Subject to any disclaimer, the term of this patent is extended or adjusted under 35 U.S.C. 154(b) by 552 days.

(21) Appl. No.: 12/546,855

(22) Filed: Aug. 25, 2009

(65) Prior Publication Data

US 2011/0053378 A1 Mar. 3, 2011

(51) Int. Cl.
*H01L 21/302* (2006.01)
(52) U.S. Cl. .......... 438/745; 438/689; 438/756; 216/83; 216/96; 216/97
(58) Field of Classification Search .................. None
See application file for complete search history.

(56) References Cited

U.S. PATENT DOCUMENTS

| 4,759,823 | A | * | 7/1988 | Asselanis et al. | 216/101 |
| 5,476,816 | A | * | 12/1995 | Mautz et al. | 438/622 |
| 6,692,976 | B1 | * | 2/2004 | Mirkarimi et al. | 438/3 |
| 2006/0261388 | A1 | * | 11/2006 | Shin et al. | 257/295 |
| 2008/0121622 | A1 | * | 5/2008 | Hwang et al. | 216/99 |

* cited by examiner

*Primary Examiner* — Lan Vinh
*Assistant Examiner* — Jiong-Ping Lu

(57) ABSTRACT

An etchant for dielectrics, such as silicon dioxide, that leaves monocrystalline silicon surface exposed by the etchant free of etch damage, such as etch pits, when the etch is done in the presence of transition metals, such as copper, tungsten, titanium, gold, etc. The etchant comprises hydrofluoric acid and a source of halide anion, such as hydrochloric acid or a metal-halide. The etchant is useful in microelectromechanical system device fabrication and in deprocessing integrated circuits or the like.

20 Claims, 3 Drawing Sheets

DIELECTRIC ETCHING

TECHNICAL FIELD

The present invention relates to semiconductor fabrication and microelectromechanical system fabrication generally and, more specifically, to etchants for removing dielectrics on a silicon surface.

BACKGROUND

It is well known in the integrated circuit manufacturing industry that a dielectric, such as silicon dioxide ($SiO_2$), can be etched using hydrofluoric acid (HF). A typical etchant is buffered hydrofluoric acid (BHF; sometimes referred to as a buffered oxide etchant or BOE) that contains HF and an ammonium fluoride buffer ($NH_4F$) to control etch rate and pH. BHF is widely used because it is very selective, i.e., the rate HF etches dielectric is several orders of magnitude greater than HF etches silicon (Si). Because the silicon is essentially unaffected by HF, a silicon surface exposed by the removal of an overlying dielectric is clean and free of etch-induced defects. However, with the substitution of copper for aluminum as the metal used to make conductors in integrated circuits, etching the dielectric with embedded copper conductors using an HF-containing etch results in the silicon surface having etch-induced damage or defects known as etch pits. These undesirable defects are believed to be a result of copper ions in the etchant which alter the silicon surface, making the surface susceptible to attach by HF. Unfortunately, the formation of etch pits may hinder the development of low-cost silicon-based microelectromechanical system (MEMS) devices, such as optical switches having arrays of movable silicon mirrors, because etch pits in mirror surfaces scatter reflected light.

SUMMARY

In one embodiment, the present invention is a method comprising the steps of providing a device having a silicon layer with dielectric thereon and etching the dielectric, in the presence of a material comprising at least one transition metal, with an etchant to expose at least a portion of the silicon layer. The etchant comprises HF, a buffering agent, and a transition metal sequestering agent. Etching the dielectric with the above-described etchant will leave the exposed silicon layer without significant etch-induced damage.

In another embodiment, the present invention is a method comprising the steps of providing a device having a layer of silicon with dielectric thereon and etching the dielectric, in the presence of a material comprising at least one transition metal, with an etchant to expose at least a portion of the silicon wafer. The etchant comprises HF and a transition metal sequestering agent, the transition metal sequestering agent comprising a halide anion provided by a water-soluble metal-halide dissolved in water. Etching the dielectric with the above-described etchant will leave the exposed silicon layer without significant etch-induced damage.

BRIEF DESCRIPTION OF THE DRAWINGS

The aspects, features, and advantages of the present invention will become more fully apparent from the following detailed description, the appended claims, and the accompanying drawings in which like reference numerals identify similar or identical elements. It is understood that the accompanying drawings are illustrative and are not drawn to scale.

DETAILED DESCRIPTION

For purposes of this description and unless explicitly stated otherwise, each numerical value and range should be interpreted as being approximate as if the word "about" or "approximately" preceded the numerical value or range. Further, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the terms "implementation" and "example."

Figure 1:
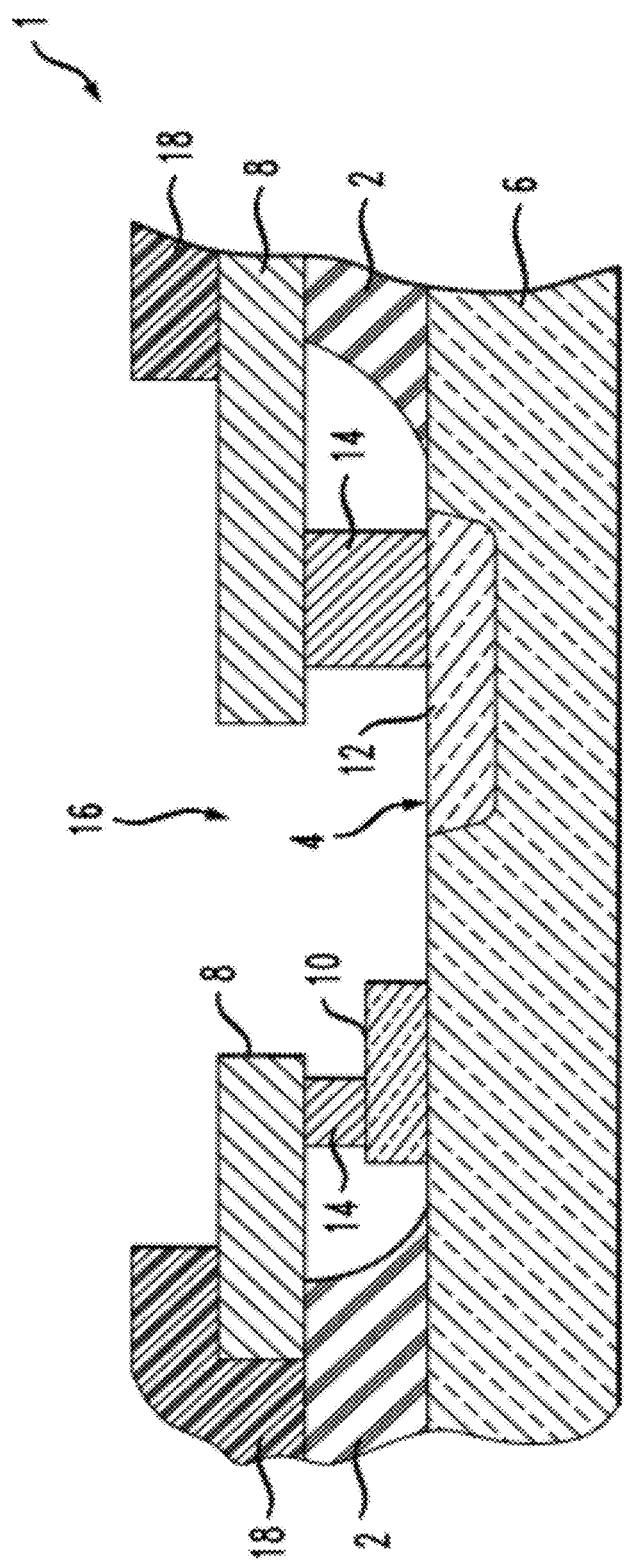
FIG. 1 is a cross-section view of a simplified exemplary integrated circuit structure.

FIG. 1 illustrates a partial removal of an overlying dielectric layer 2 (typically composed of silicon dioxide, silicon nitride, or a glass such as siloxane, silicate, or any other material suitable for use as a dielectric layer in integrated circuit manufacturing) from a simplified integrated circuit 1, exposing an underlying silicon surface 4 of a silicon wafer 6. Metal conductors 8 are formed in the surface of the oxide layer 2 and may contact polysilicon layers 10 and conductive regions 12 (e.g., source and drain contact regions) in the monocrystalline silicon wafer 6 through vias 14. The metals used in the conductors 8, conductive regions 12, and vias 14 are typically transition metals, such as Ti, Ta, W, Cu, Au, Ni, Cr, Co, Pd, Pt, a non-transition metal such as Al, or a combination of the aforementioned metals (e.g., aluminum conductors 8 and tungsten vias 14). As discussed above, the dielectric layer 2 (or more dielectric layers, not shown, above layer 2) is etched away to form an opening 16 in the layer 2, thereby exposing the silicon surface 4, conductors 8, and vias 14. Opening 16 corresponds to an opening (not numbered) in a conventional mask 18 (e.g., a patterned photomask) overlying the dielectric layer 2. Without the mask 18, the entire dielectric layer 2 would be absent after the etch.

If the conductors 8, regions 12, or vias 14 comprise a transition metal, then using a conventional dielectric etchant containing HF will result in the now-exposed silicon surface 4 having undesired etch-induced damage as described above and as shown in FIG. 2.

Figure 2:
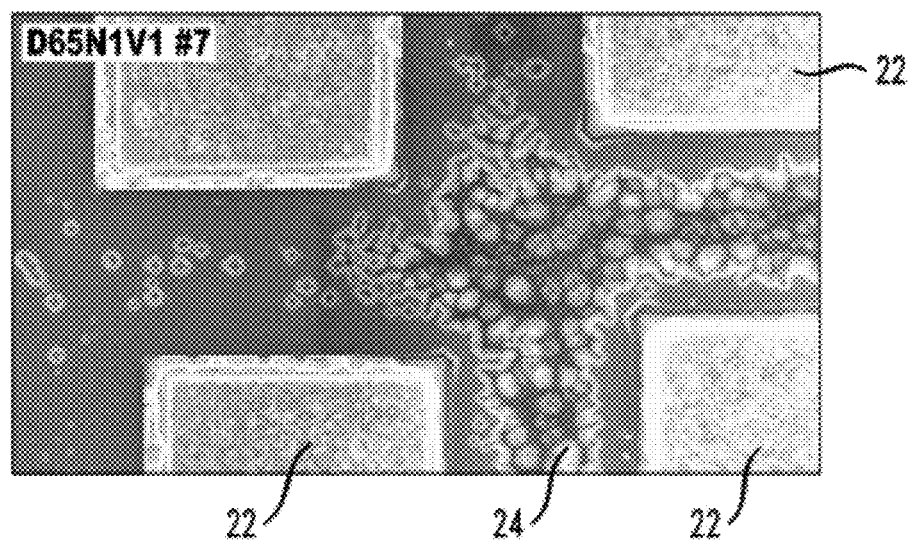
FIG. 2 is a scanning electron microscope (SEM) image of a silicon surface after an etch to remove dielectric layers on the silicon surface.
Figure 3:
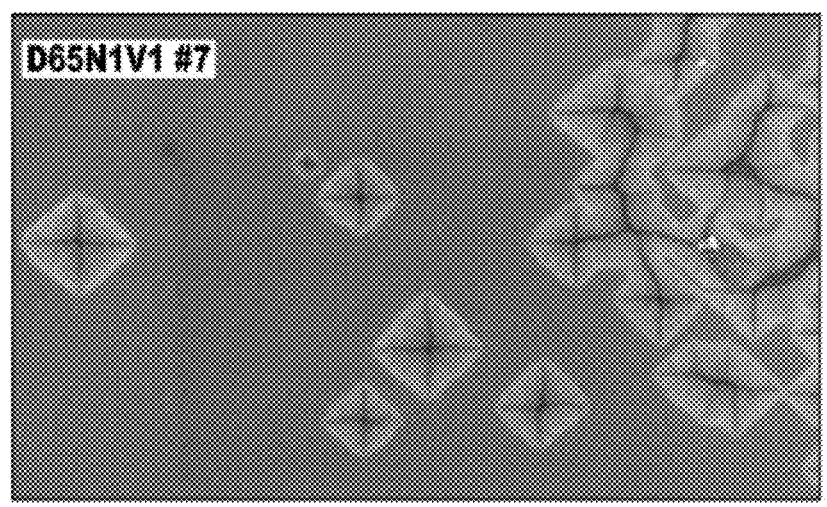
FIG. 3 is an SEM image of the silicon surface in FIG. 2 with higher magnification.

The SEM image in FIG. 2 shows a portion 10 of a monocrystalline silicon substrate surface of a silicon integrated circuit after removal of overlaying dielectric layers. The dielectric layers (not shown), composed of silicon dioxide ($SiO_2$), had various copper conductors embedded therein (not shown). The dielectric layers were etched away using a room temperature, commercially available HF etchant (49 wt % HF in water), and the remaining copper conductors removed during a water rinse of the silicon substrate after the HF etch. Between polysilicon features 22 on the substrate surface, a roughness 24 to the silicon surface is seen, the roughness being damage formed in the silicon surface during the etching process. FIG. 3 is a higher magnification SEM image of the image in FIG. 2 showing the etch-induced damage as multiple etch pits. It is believed that the etch pits are formed along the <111> crystallographic planes in the monocrystalline silicon substrate but noncrystallographic-oriented damage has also been observed. While not wishing to be held to any particular theory, it is believed that the etch pits are the result of copper (or any transition metal) ions in the etchant due to a transition metal-containing material being present (i.e., exposed to the etchant) during the etch. Experiments have shown that various transition metals (metals arranged between groups II and III on the periodic table of the elements) used in integrated circuit and MEMS fabrication, such as Cu, W, Ti, Ni, Pd, Pt, Co, Ta, Au, Cr, etc., or compounds comprising one or more transition metals (e.g., TiN, $CoSi_2$), present during the HF etching process results in the illustrated etch-induced damage on the substrate surface. By including a transition metal sequestering agent in the HF-containing etchant, the etch-induced damage is substantially reduced. An exemplary sequestering agent is a halide anion, such as $Cl^-$, $Br^-$, and $I^-$. Dissolved water-soluble metal-halide in water provides the halide anions. Exemplary sources for the halide anion are hydrochloric acid (HCl) and water-soluble metal-halides. Exemplary water-soluble metal-halides include chloride salts such as sodium chloride (NaCl), iodide salts such as potassium iodide (KI), and bromine salts such as magnesium bromide ($MgBr_2$). It is understood that other metal-halide combinations may be used, such as $CaCl_2$, $CaBr_2$, $CaI_2$, $MgCl_2$, $MgI_2$, NaBr, NaI, KCl, etc.

While not wishing to be held to a particular theory, it is believed that the transition metal sequestering agent neutralizes or sequesters the transition metal ion in the etchant by combining with the metal ion to form, for example, a transition metal-halide complex such as $CuCl_4^{-2}$.

The etchant may be diluted with water, ethylene glycol, or a mixture thereof as needed. However, the HF molarity of the etchant should range from about 0.014 moles per liter (mol/l) to about 22 mol/l; the weaker the HF molarity of the etchant, the slower the dielectric etch. As is well understood in the art, the desired HF molarity of the etchant depends on the particular application in which the etchant is used.

Exemplary mole ratios of halide anion to HF range from about 1:7 to about 100:1 and, preferably, the mole ratio is between about 0.21:1 to about 0.84:1 and, specifically, about 0.42:1. For example, using conventional, commercially available BHF and HCl, the HCl to HF molar ratio ranges from about 0.21:1 to about 0.84:1 and the $NH_4F$ buffer to HF mole ratio ranges from about 100:1 to about 1:10, resulting in the HF molarity of the etchant ranging from about 0.014 moles per liter (mol/l) to about 22 mol/l. Similar ratios may be used when using a metal-halide as the source for the halide anion. In one illustrative embodiment, an approximately 1:1:6 volume ratio for commercially available HF (49 wt % in water) to commercially available HCl (37 wt % in water) to $NH_4F$ buffer (40 wt % in water) results in an etchant having a chlorine anion to HF mole ratio of about 0.44:1 and a molarity of 3.6 mol/l that removes $SiO_2$ with imbedded Cu conductors at a rate of approximately 200 nm/minute at room temperature with no apparent etch-induced damage to a silicon surface exposed to the etchant. Alternatively, NaCl can be substituted for HCl in the above etchant, by dissolving about 7.8 g of NaCl in about 22 cc of $H_2O$ and adding sufficient HF (49 wt % in water) and $NH_4F$ (40 wt % in water) in a volume ratio of 1:6 to make about 100 cc of total etchant solution, resulting in an etchant with an HF molarity of about 3.2 mol/l and a HF mole ratio of about 0.42:1. In still another embodiment, about 23.8 g of NaCl can be dissolved in about 66 cc of $H_2O$ and added to about 34 cc of HF (49 wt % in water), resulting in about 100 cc of etchant with an HF molarity of about 9.8 mol/l and a HF mole ratio of about 0.42:1.

Figure 4:
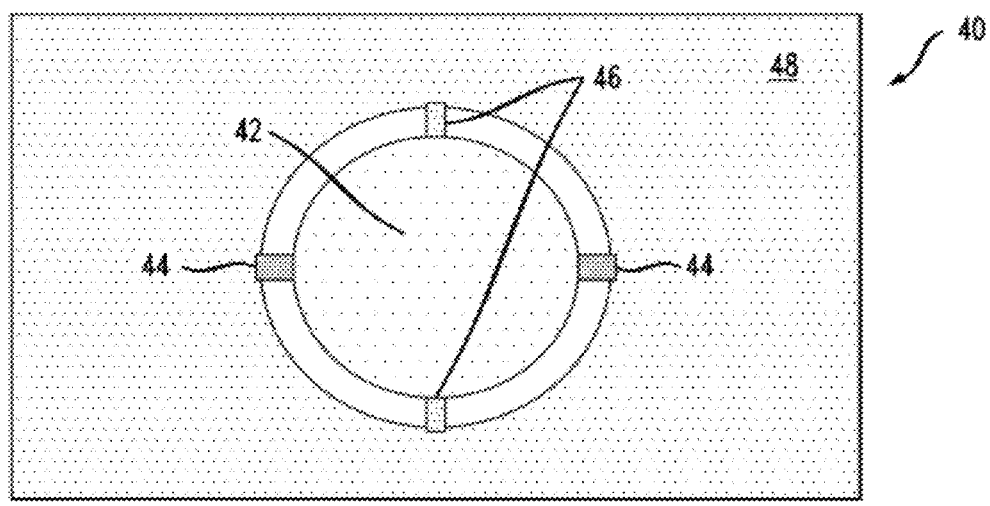
FIGS. 4 and 5 are simplified plan-view diagrams of one embodiment of an exemplary silicon MEMS mirror structure.
Figure 5:
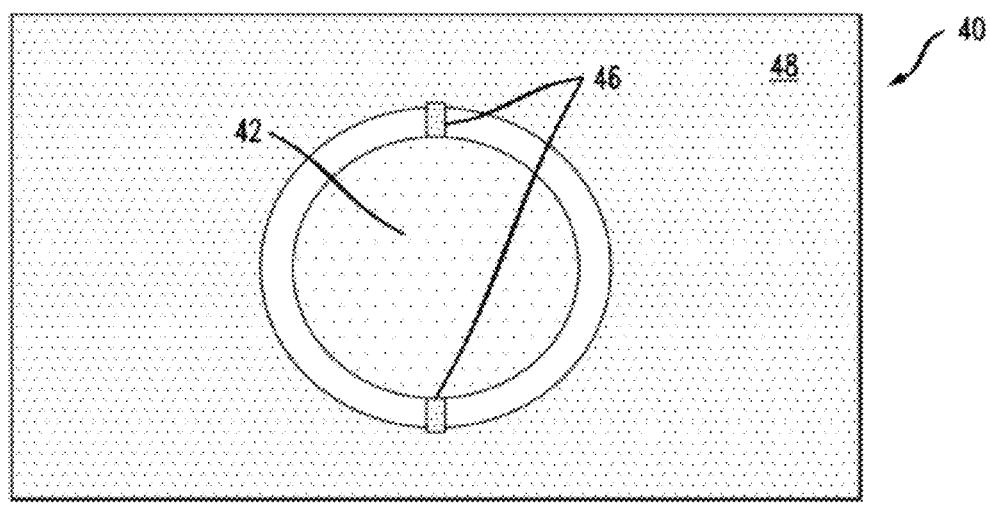

An exemplary use of the above-described etch is illustrated in FIGS. 4 and 5, where a simplified diagram of a portion 40 of a partially completed MEMS mirror array (the entire array is not shown) at two different stages of fabrication.

In FIG. 4, one exemplary mirror 42 of the array of mirrors is a smooth layer of silicon supported by silicon dioxide pillars 44 and metal conductors 46. The oxide pillars 44 were formed at an earlier step for the purpose of supporting the mirror 42 when the mirror was separated from the surrounding silicon surface 48 by etching (for purposes of scale, the mirror 42 is less than a millimeter in diameter). The metal conductors 46 are formed using any well-known process that includes depositing a metal layer (e.g., copper) over the entire surface of the array and then patterning metal layer to leave at least the conductors 46. The metal conductors 46 work as hinges to allow electrostatic deflection of the mirror 42 during operation of the MEMS array and can provide a conductive path between the mirror 42 and the other mirrors (not shown) and control circuitry (not shown). Thus, at this point, a layer of silicon dioxide (not shown) is present on the silicon surface 48 and metal conductors (not shown) are on or in the layer of silicon dioxide. However, the surface of mirror 42 is bare silicon.

In FIG. 5, the silicon surface 48 is masked (not shown) and the oxide pillars 44 in FIG. 4 are removed using the oxide etch described above, thereby freeing the mirror 42. Because the oxide pillars 44 are removed by etching in the presence of copper (in the conductors 46) using the above-described etchant, the etchant will not attack the surface of the silicon mirror and leave the mirror 42 substantially free of light-scattering defects.

Although the present invention has been described in the context of etching silicon dioxide in a device to expose a layer of silicon, those skilled in the art will understand that the present invention can be implemented in the context of other types of integrated circuit or MEMS devices as well as other types of silicon-based devices or applications.

It is also understood that various changes in the details, materials, and arrangements of the parts which have been described and illustrated in order to explain the nature of this invention may be made by those skilled in the art without departing from the scope of the invention as expressed in the following claims.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The invention claimed is:

1. A method of etching, comprising the steps of: providing a device having a silicon layer with dielectric thereon; and etching the dielectric, in the presence of a material comprising at least one transition metal, with an etchant to expose at least a portion of the silicon layer; wherein the etchant consists of:

a first volume of about 49 percent by weight HF in a diluent;

a second volume of about 37 percent by weight transition metal sequestering agent in the diluent, the second volume being about the same as the first volume; and a remaining volume of about 40 percent by weight buffering agent in the diluent, the remaining volume being about six times the first volume.

2. The method of claim 1, wherein the transition metal sequestering agent is a halide anion from the group consisting of a chloride ion, a bromide ion, and an iodide ion, and the etchant has a halide anion to HF mole ratio of about 1:7 to about 100:1.

3. The method of claim 2, wherein the halide anion is selected from the group of chlorine, iodine, and bromine, and the halide anion to HF mole ratio is from 0.21:1 to 0.84:1.

4. The method of claim 1, wherein the transition metal sequestering agent is provided by a water-soluble metal-halide dissolved in water.

5. The method of claim 4, wherein the metal in the water-soluble metal-halide is selected from the group of sodium, potassium, magnesium, and calcium, and the halide is selected from the group of chlorine, iodine, and bromine.

6. The method of claim 1, wherein the transition metal sequestering agent is provided by HCl and the etchant has an HCl to HF mole ratio of about 1:7 to about 100:1.

7. The method of claim 1, wherein the transition metal sequestering agent is provided by HCl and the etchant has an HCl to HF mole ratio of about 0.21:1 to about 0.84:1.

8. The method of claim 1, wherein the transition metal is from the group of: Cu, Ti, W, Ni, Cr, Co, Ta, Pd, Pt, and Au.

9. The method of claim 1, wherein the dielectric is silicon dioxide or a glass.

10. The method of claim 1, wherein the buffering agent is ammonium fluoride and the etchant has an ammonium fluoride to HF mole ratio of about 100:1 to about 1:10.

11. The method of claim 1, wherein the etchant is diluted with water, ethylene glycol, or a combination of water and ethylene glycol, wherein the etchant has an HF molarity of about 0.014 mol/l to about 22 mol/l.

12. The method of claim 1, wherein the material is a nitride or a silicide of the transition metal.

13. A method of etching, comprising the steps of: providing a device having a layer of silicon with dielectric thereon; and etching the dielectric, in the presence of a material comprising at least one transition metal, with an etchant to expose at least a portion of the silicon wafer; wherein the etchant comprises HF, a transition metal sequestering agent, the transition metal sequestering agent comprising a halide anion provided by a water-soluble metal-halide dissolved in ethylene glycol, and over 10 percent by volume of a buffering agent.

14. The method of claim 13, wherein the metal in the metal-halide is selected from the group of sodium, potassium, magnesium, and calcium, and the halide is selected from the group of chlorine, iodine, and bromine, and wherein the etchant has a halide anion to HF mole ratio of about 1:7 to about 100:1.

15. The method of claim 14, wherein the halide anion to HF mole ratio ranges from about 0.21:1 to about 0.84:1.

16. The method of claim 13, wherein the transition metal is from the group of: Cu, Ti, W, Ni, Cr, Co, Ta, Pd, Pt, and Au.

17. The method of claim 13, wherein the dielectric is silicon dioxide or a glass.

18. The method of claim 13, wherein the etchant includes a buffering agent of ammonium fluoride and the etchant has an ammonium fluoride to HF mole ratio of about 100:1 to about 1:10.

19. The method of claim 13, wherein the etchant is further diluted with water, and wherein the etchant has an HF molarity of about 0.014 mol/l to about 22 mol/l.

20. A method of etching, comprising the steps of: providing a device having a silicon layer and a silicon dioxide layer on the silicon layer, the silicon dioxide layer including a layer of copper in contact therewith; etching the silicon dioxide layer, in the presence of the copper layer, using a mixture of BHF and HCl to expose at least a portion of the silicon layer, thereby leaving the exposed layer of silicon without significant etch-induced damage; wherein the etchant has an HCl to HF mole ratio of about 0.21:1 to about 0.84:1 and wherein the etchant consists of HCl, HF, a buffer, and water.

* * * * *